(12) United States Patent
Amir et al.

(10) Patent No.: US 10,890,436 B2
(45) Date of Patent: Jan. 12, 2021

(54) OVERLAY TARGETS WITH ORTHOGONAL UNDERLAYER DUMMYFILL

(71) Applicant: KLA-Tencor Corporation, Milpitas, CA (US)

(72) Inventors: Nuriel Amir, Yokne'am (IL); Guy Cohen, Yaad (IL); Vladimir Levinski, Nazareth Ilit (IL); Michael Adel, Ya'akov (IL)

(73) Assignee: KLA Corporation, Milpitas, CA (US)

( * ) Notice: Subject to any disclaimer, the term of this patent is extended or adjusted under 35 U.S.C. 154(b) by 395 days.

(21) Appl. No.: 13/898,828

(22) Filed: May 21, 2013

(65) Prior Publication Data

US 2013/0293890 A1 Nov. 7, 2013

Related U.S. Application Data

(63) Continuation-in-part of application No. 13/186,144, filed on Jul. 19, 2011.
(Continued)

(51) Int. Cl.
*G01B 11/14* (2006.01)
*G03F 7/20* (2006.01)

(52) U.S. Cl.
CPC .......... *G01B 11/14* (2013.01); *G03F 7/70633* (2013.01); *G03F 7/70683* (2013.01)

(58) Field of Classification Search
CPC .................... G03F 7/70633; G03F 7/70683
See application file for complete search history.

(56) References Cited

U.S. PATENT DOCUMENTS

| 4,166,219 A | 8/1979 | Ausschnitt et al. |
| 4,251,160 A | 2/1981 | Bouwhuis et al. |
(Continued)

FOREIGN PATENT DOCUMENTS

| CN | 1973371 A | 5/2007 |
| CN | 101114130 A | 1/2008 |
(Continued)

OTHER PUBLICATIONS

Junxiong, Zhou, et al. "Dummy fill effect on CMP planarity." Journal of Semiconductors 31.10 (2010): 106003.*
(Continued)

*Primary Examiner* — Michael A Lyons
(74) *Attorney, Agent, or Firm* — Suiter Swantz pc llo

(57) ABSTRACT

The disclosure is directed to designing and using an overlay target with orthogonal underlayer dummyfill. According to various embodiments, an overlay target may include one or more segmented overlay pattern elements forming at least one overlay target structure. The overlay target may further include one or more inactive pattern elements forming at least one dummyfill target structure. Each of the one or more inactive pattern elements may include dummyfill segmented along an axis orthogonal to a segmentation axis of at least one proximately disposed overlay pattern element. In some embodiments, each of the target structures or layers may be formed from a separate process layer successively disposed upon a substrate, such as a silicon wafer. In some embodiments, the overlay and dummyfill target structures may be twofold or fourfold rotationally symmetric to allow for certain manufacturing or metrology advantages.

41 Claims, 13 Drawing Sheets

Related U.S. Application Data

(60) Provisional application No. 61/650,269, filed on May 22, 2012.

(56) References Cited

U.S. PATENT DOCUMENTS

| | | | |
|---|---|---|---|
| 4,290,384 A | 9/1981 | Ausschnitt et al. | |
| 4,437,760 A | 3/1984 | Ausschnitt | |
| 4,475,811 A | 10/1984 | Brunner | |
| 4,538,105 A | 8/1985 | Ausschnitt | |
| 4,568,189 A | 2/1986 | Bass et al. | |
| 4,703,434 A | 10/1987 | Brunner | |
| 4,714,874 A | 12/1987 | Morris et al. | |
| 4,757,207 A | 7/1988 | Chappelow et al. | |
| 4,757,707 A | 7/1988 | Harvey et al. | |
| 4,778,275 A | 10/1988 | van den Brink et al. | |
| 4,782,288 A | 11/1988 | Vento | |
| 4,818,110 A | 4/1989 | Davidson | |
| 4,820,055 A | 4/1989 | Muller | |
| 4,848,911 A | 7/1989 | Uchida et al. | |
| 4,855,253 A | 8/1989 | Weber | |
| 4,890,239 A | 12/1989 | Ausschnitt et al. | |
| 4,912,487 A * | 3/1990 | Porter et al. | 347/255 |
| 4,929,083 A | 5/1990 | Brunner | |
| 5,017,514 A | 5/1991 | Nishimoto | |
| 5,100,237 A | 3/1992 | Wittekoek et al. | |
| 5,112,129 A | 5/1992 | Davidson et al. | |
| 5,148,214 A | 9/1992 | Ohta et al. | |
| 5,156,982 A | 10/1992 | Nagoya | |
| 5,172,190 A | 12/1992 | Kaiser | |
| 5,216,257 A | 6/1993 | Brueck et al. | |
| 5,262,258 A | 11/1993 | Yanagisawa | |
| 5,278,105 A * | 1/1994 | Eden | H01L 21/0334 257/922 |
| 5,296,917 A | 3/1994 | Kusonose et al. | |
| 5,300,786 A | 4/1994 | Brunner et al. | |
| 5,343,292 A | 8/1994 | Brueck et al. | |
| 5,347,356 A * | 9/1994 | Ota et al. | 356/490 |
| 5,383,136 A | 1/1995 | Cresswell et al. | |
| 5,414,514 A | 5/1995 | Smith et al. | |
| 5,436,097 A * | 7/1995 | Norishima | G03F 7/706 257/E21.53 |
| 5,438,413 A | 8/1995 | Mazor et al. | |
| 5,477,057 A | 12/1995 | Angeley et al. | |
| 5,479,270 A | 12/1995 | Taylor | |
| 5,481,362 A | 1/1996 | Van Den Brink et al. | |
| 5,498,501 A | 3/1996 | Shimoda et al. | |
| 5,545,593 A | 8/1996 | Watkins et al. | |
| 5,596,413 A | 1/1997 | Stanton et al. | |
| 5,604,819 A | 2/1997 | Barnard | |
| 5,617,340 A * | 4/1997 | Cresswell et al. | 702/85 |
| 5,627,083 A | 5/1997 | Tounai | |
| 5,629,772 A | 5/1997 | Ausschnitt | |
| 5,665,495 A | 9/1997 | Hwang | |
| 5,674,650 A | 10/1997 | Dirksen et al. | |
| 5,699,282 A | 12/1997 | Allen et al. | |
| 5,701,013 A | 12/1997 | Hsia et al. | |
| 5,702,567 A | 12/1997 | Mitsui et al. | |
| 5,703,685 A | 12/1997 | Senda et al. | |
| 5,712,707 A | 1/1998 | Ausschnitt et al. | |
| 5,731,877 A | 3/1998 | Ausschnitt | |
| 5,756,242 A | 5/1998 | Koizumi et al. | |
| 5,757,507 A | 5/1998 | Ausschnitt et al. | |
| 5,766,809 A | 6/1998 | Bae | |
| 5,776,645 A | 7/1998 | Barr et al. | |
| 5,783,342 A | 7/1998 | Yamashita et al. | |
| 5,790,254 A | 8/1998 | Ausschnitt | |
| 5,805,290 A | 9/1998 | Ausschnitt et al. | |
| 5,835,196 A | 11/1998 | Jackson | |
| 5,857,258 A | 1/1999 | Penzes et al. | |
| 5,863,680 A | 1/1999 | Kawakubo et al. | |
| 5,872,042 A | 2/1999 | Hsu et al. | |
| 5,877,036 A | 3/1999 | Kawai | |
| 5,877,861 A | 3/1999 | Ausschnitt et al. | |
| 5,902,703 A | 5/1999 | Leroux et al. | |
| 5,912,983 A | 6/1999 | Hiratsuka | |
| 5,914,784 A | 6/1999 | Ausschnitt et al. | |
| 5,923,041 A | 7/1999 | Cresswell et al. | |
| 5,928,822 A | 7/1999 | Rhyu | |
| 5,939,226 A | 8/1999 | Tomimatu | |
| 5,949,145 A | 9/1999 | Komuro | |
| 5,949,547 A | 9/1999 | Tseng et al. | |
| 5,952,134 A | 9/1999 | Hwang | |
| 5,952,241 A | 9/1999 | Baker et al. | |
| 5,953,128 A | 9/1999 | Ausschnitt et al. | |
| 5,960,125 A | 9/1999 | Michael et al. | |
| 5,965,309 A | 10/1999 | Ausschnitt et al. | |
| 5,968,693 A | 10/1999 | Adams | |
| 5,976,740 A | 11/1999 | Ausschnitt et al. | |
| 5,981,119 A | 11/1999 | Adams | |
| 5,985,495 A | 11/1999 | Okumura et al. | |
| 6,003,223 A | 12/1999 | Hagen et al. | |
| 6,004,706 A | 12/1999 | Ausschnitt et al. | |
| 6,020,966 A | 2/2000 | Ausschnitt et al. | |
| 6,023,338 A | 2/2000 | Bareket | |
| 6,027,842 A | 2/2000 | Ausschnitt et al. | |
| 6,037,671 A | 3/2000 | Kepler et al. | |
| 6,042,976 A | 3/2000 | Chiang et al. | |
| 6,061,119 A | 5/2000 | Ota | |
| 6,061,606 A | 5/2000 | Ross | |
| 6,077,756 A | 6/2000 | Lin et al. | |
| 6,079,256 A | 6/2000 | Bareket | |
| 6,084,679 A | 7/2000 | Steffan et al. | |
| 6,118,185 A | 9/2000 | Chen et al. | |
| 6,128,089 A | 10/2000 | Ausschnitt et al. | |
| 6,130,750 A | 10/2000 | Ausschnitt et al. | |
| 6,137,578 A | 10/2000 | Ausschnitt | |
| 6,140,217 A | 10/2000 | Jones et al. | |
| 6,146,910 A | 11/2000 | Cresswell et al. | |
| 6,160,622 A | 12/2000 | Dirksen et al. | |
| 6,165,656 A | 12/2000 | Tomimatu | |
| 6,172,349 B1 | 1/2001 | Katz et al. | |
| 6,183,919 B1 | 2/2001 | Ausschnitt et al. | |
| 6,218,200 B1 | 4/2001 | Chen et al. | |
| 6,317,211 B1 | 11/2001 | Ausschnitt et al. | |
| 6,335,151 B1 | 1/2002 | Ausschnitt et al. | |
| 6,346,979 B1 | 2/2002 | Ausschnitt et al. | |
| 6,350,548 B1 | 2/2002 | Leidy et al. | |
| 6,384,899 B1 | 5/2002 | den Boef | |
| 6,405,096 B1 | 6/2002 | Toprac et al. | |
| 6,417,929 B1 | 7/2002 | Ausschnitt et al. | |
| 6,429,667 B1 | 8/2002 | Ausschnitt et al. | |
| 6,457,169 B1 | 9/2002 | Ross | |
| 6,460,265 B2 | 10/2002 | Pogge et al. | |
| 6,462,818 B1 | 10/2002 | Bareket | |
| 6,612,159 B1 | 9/2003 | Knutrud | |
| 6,638,671 B2 | 10/2003 | Ausschnitt et al. | |
| 6,664,121 B2 | 12/2003 | Grodnensky et al. | |
| 6,675,053 B2 | 1/2004 | Baluswamy et al. | |
| 6,734,549 B2 | 5/2004 | Takeoka et al. | |
| 6,734,971 B2 | 5/2004 | Smith et al. | |
| 6,753,120 B2 | 6/2004 | Kim | |
| 6,766,211 B1 | 7/2004 | Ausschnitt | |
| 6,803,995 B2 | 10/2004 | Ausschnitt | |
| 6,842,237 B2 | 1/2005 | Ausschnitt et al. | |
| 6,869,739 B1 | 3/2005 | Ausschnitt et al. | |
| 6,879,400 B2 | 4/2005 | Ausschnitt et al. | |
| 6,921,916 B2 | 7/2005 | Adel et al. | |
| 6,937,337 B2 | 8/2005 | Ausschnitt et al. | |
| 6,952,886 B1 | 10/2005 | Kim | |
| 6,975,398 B2 | 12/2005 | Ausschnitt et al. | |
| 6,985,618 B2 | 1/2006 | Adel et al. | |
| 7,019,836 B2 | 3/2006 | Mishima | |
| 7,042,551 B2 | 5/2006 | Ausschnitt | |
| 7,061,615 B1 | 6/2006 | Lowe-Webb | |
| 7,068,833 B1 | 6/2006 | Ghinovker et al. | |
| 7,126,669 B2 | 10/2006 | Edart | |
| 7,180,593 B2 | 2/2007 | Lin | |
| 7,242,477 B2 * | 7/2007 | Mieher et al. | 356/401 |
| 7,336,352 B2 | 2/2008 | Tanaka | |
| 7,346,878 B1 | 3/2008 | Cohen et al. | |
| 7,355,291 B2 | 4/2008 | Adel et al. | |
| 7,359,054 B2 | 4/2008 | Ausschnitt et al. | |
| 7,379,184 B2 | 5/2008 | Smith et al. | |

(56) References Cited

U.S. PATENT DOCUMENTS

| | | |
|---|---|---|
| 7,473,502 B1 | 1/2009 | Ausschnitt et al. |
| 7,474,401 B2 | 1/2009 | Ausschnitt et al. |
| 7,480,892 B2 | 1/2009 | Chiu et al. |
| 7,526,749 B2 * | 4/2009 | Levinski et al. .......... 716/50 |
| 7,556,898 B2 | 7/2009 | Marokkey |
| 7,608,468 B1 | 10/2009 | Ghinovker et al. |
| 7,671,990 B1 | 3/2010 | Adel et al. |
| 7,804,994 B2 | 9/2010 | Adel et al. |
| 8,115,938 B2 * | 2/2012 | Van Haren .......... G03F 7/70633 356/614 |
| 8,243,273 B2 | 8/2012 | Levinski et al. |
| 8,330,281 B2 | 12/2012 | Ghinovker et al. |
| 8,339,605 B2 | 12/2012 | Ausschnitt et al. |
| 8,513,822 B1 | 8/2013 | Ghinovker |
| 2001/0001900 A1 | 5/2001 | Pogge et al. |
| 2001/0003382 A1 * | 6/2001 | Sugiyama .......... G03F 9/7084 257/797 |
| 2001/0055720 A1 | 12/2001 | Sato et al. |
| 2002/0097399 A1 | 7/2002 | Ausschnitt et al. |
| 2003/0021465 A1 | 1/2003 | Adel et al. |
| 2003/0021466 A1 | 1/2003 | Adel et al. |
| 2003/0021467 A1 | 1/2003 | Adel et al. |
| 2003/0026471 A1 | 2/2003 | Adel et al. |
| 2003/0053057 A1 | 3/2003 | Mishima |
| 2003/0071997 A1 | 4/2003 | Ausschnitt et al. |
| 2003/0077527 A1 | 4/2003 | Ausschnitt et al. |
| 2003/0102440 A1 | 6/2003 | Sohn |
| 2003/0113641 A1 | 6/2003 | Leidy et al. |
| 2003/0123052 A1 | 7/2003 | Ausschnitt et al. |
| 2004/0185637 A1 * | 9/2004 | Fu .......... H01L 21/76229 438/401 |
| 2004/0233441 A1 | 11/2004 | Mieher et al. |
| 2005/0012928 A1 | 1/2005 | Sezginer et al. |
| 2005/0094145 A1 | 5/2005 | Lin |
| 2005/0105092 A1 | 5/2005 | Ausschnitt et al. |
| 2005/0173634 A1 | 8/2005 | Wong et al. |
| 2005/0286052 A1 | 12/2005 | Huggins et al. |
| 2006/0033921 A1 | 2/2006 | Den Boef et al. |
| 2006/0039595 A1 | 2/2006 | Adel et al. |
| 2006/0066855 A1 | 3/2006 | Boef et al. |
| 2006/0080046 A1 | 4/2006 | Ziger et al. |
| 2006/0139596 A1 | 6/2006 | Edart |
| 2006/0177120 A1 | 8/2006 | Ghinovker et al. |
| 2006/0204073 A1 | 9/2006 | Ghinovker et al. |
| 2007/0008533 A1 | 1/2007 | Ghinovker |
| 2007/0058169 A1 | 3/2007 | Ausschnitt et al. |
| 2007/0076205 A1 | 4/2007 | Schulz |
| 2007/0096094 A1 | 5/2007 | Levinski et al. |
| 2007/0134923 A1 | 6/2007 | Chen et al. |
| 2007/0229829 A1 | 10/2007 | Kandel et al. |
| 2008/0024744 A1 | 1/2008 | Van Horssen |
| 2008/0034344 A1 | 2/2008 | Chiu et al. |
| 2008/0121939 A1 * | 5/2008 | Murray et al. .......... 257/202 |
| 2009/0186286 A1 | 7/2009 | Ausschnitt et al. |
| 2009/0224413 A1 | 9/2009 | Ghinovker |
| 2009/0244538 A1 | 10/2009 | Den Boef et al. |
| 2010/0155968 A1 | 6/2010 | Ghinovker et al. |
| 2010/0190096 A1 | 7/2010 | Ausschnitt et al. |
| 2011/0248388 A1 | 10/2011 | Ausschnitt |
| 2012/0033215 A1 | 2/2012 | Kandel |
| 2018/0196357 A1 | 7/2018 | Middlebrooks |

FOREIGN PATENT DOCUMENTS

| | | |
|---|---|---|
| CN | 101178744 A | 5/2008 |
| CN | 101526757 A | 9/2009 |
| EP | 0818814 A2 | 1/1998 |
| EP | 0947828 A2 | 10/1999 |
| JP | 61168227 A | 7/1986 |
| JP | 61170032 A | 7/1986 |
| JP | 01214117 A | 8/1989 |
| JP | 2260441 A | 10/1990 |
| JP | 05127364 A | 5/1993 |
| JP | H07226369 A | 8/1995 |
| JP | 10213895 | 8/1998 |
| JP | 11067631 | 3/1999 |
| JP | 11095407 | 4/1999 |
| JP | 2000294487 A | 10/2000 |
| JP | 2001297958 A | 10/2001 |
| JP | 2002124458 A | 4/2002 |
| JP | 2008503897 A | 2/2008 |
| JP | 2009500863 A | 1/2009 |
| JP | 2009514230 A | 4/2009 |
| JP | 2011199282 A | 10/2011 |
| KR | 102008003545 | 4/2008 |
| TW | 200500504 A | 1/2005 |
| TW | 200605255 A | 2/2006 |
| WO | 00219415 A1 | 3/2002 |
| WO | 2006007297 A1 | 1/2006 |
| WO | 2009002716 A1 | 12/2008 |
| WO | 2010031510 A1 | 3/2010 |
| WO | 2011026055 A2 | 3/2011 |
| WO | 2012018673 A2 | 2/2012 |

OTHER PUBLICATIONS

Office Action dated Feb. 12, 2019 for JP Patent Application No. 2018-090295.

Ausschnitt et al. "Multilayer overlay metrology", Proc. SPIE 6152, Metrology, Inspection, and Process Control for Microlithography XX, 61520 (Mar. 24, 2006) (Year: 2006).

Binns, L. A. et al., Nanometrics; Ausschnitt, C.P., et al. IBM SDRC; "Overlay Metrology Tool Calibration", Proc. SPIE 6518 (2007), 9 pages.

Bishop, et al., "The OMAG3 Reticle Set", Jul. 31, 2003, International Sematech, Technology Transfer #3074417A-ENG, pp. 1-26.

Nelson M. Felix et al., "Smaller, smarter, faster and more accurate: The new overlay metrology, Metrology, Inspection, and Process Control for Microlithography XXIV", edited by Christopher J. Raymond, Proc. of SPIE vol. 7638, 76380Y, Copyrgt. 2010 SPIE.

Raugh, Michael R., "Self-calibration of Interferometer Stages: Mathematical Techniques for Deriving Lattice Algorithms for Nanotechnology"; Mar. 2002 (rev. Aug. 2003), 66 pages.

Office Action for JP Appln. No. 2017-120083 dated May 29, 2018, 9 pages.

Official Action dated Dec. 12, 2018 for TW Patent Application No. 107112180.

Office Action dated Jan. 18, 2019 for EP Patent Application No. 11815104.2.

Examination Report dated Oct. 7, 2019 for European Patent Application No. 11815104.2.

International Search Report from PCT Appln. No. PCT/US03/04471, dated May 22, 2003.

Office Action for KR Appln. No. 10-2014-7028219 dated Jan. 8, 2016, 18 pages.

* cited by examiner

OVERLAY TARGETS WITH ORTHOGONAL UNDERLAYER DUMMYFILL

PRIORITY

The present application claims priority to U.S. Provisional Application Ser. No. 61/650,269, entitled OVERLAY TARGETS WITH ORTHOGONAL UNDERLAYER DUMMYFILL, By Nuriel Amir et al., filed May 22, 2012 and United States Non-provisional application Ser. No. 13/186,144, entitled MULTI-LAYER OVERLAY METROLOGY TARGET AND COMPLIMENTARY OVERLAY METROLOGY MEASUREMENT SYSTEMS, By Daniel Kandel et al., filed Jul. 19, 2011, which are currently co-pending, or are applications of which currently co-pending application(s) are entitled to the benefit of the filing date.

TECHNICAL FIELD

The present disclosure generally relates to the field of overlay targets for overlay metrology and more particularly to designing and using overlay targets with orthogonal underlayer dummyfill.

BACKGROUND

Semiconductor devices are often manufactured by producing a plurality of layers disposed upon a substrate, such as a silicon wafer. The alignment between the various process layers is typically controlled to ensure proper functionality and performance of a resulting device. Misalignment between device features or structures formed within two or more successive layers is often referred to as overlay error. The ability to detect and correct overlay error between patterned layers on a wafer is critical to the manufacture of integrated circuits and other semiconductor devices.

Overlay metrology is a known technique for determining misalignments or overlay error between patterned device layers, typically by analyzing an overlay "target" or "mark" disposed proximate to one or more device layers of interest. For example, overlay measurements may be performed via test patterns (i.e. one or more overlay target structures) printed together with various patterned device layers on a wafer. An overlay metrology system may include an imaging tool configured to collect image frames that are analyzed by a processing unit to determine a relative displacement or misalignment of the pattern elements making up device and target layers.

Several techniques are currently applied to maintain or improve process compatibility of substrates supporting overlay targets. For example, one or more patterned layers of dummy fill (i.e. non-functional structures or features) may be disposed upon a substrate to achieve spatial attributes or physical characteristics required under design rules for certain semiconductor manufacturing or testing equipment. Further, pattern elements forming target structures or layers of the metrology target may be constructed from features nominally smaller than a selected segmentation or sub-pattern to improve process compatibility.

Despite existing solutions, shortcomings within the art continue to result in process damage to an overlay metrology target or a lack of target compatibility with semiconductor manufacturing design rules. Some deficiencies in the current state of the art include: dishing within or in the vicinity of the target due to chemical mechanical polishing, etch bias in the vicinity of the target due to incompatible pattern density, subsequent parasitic capacitance in a manufactured device due to design rule violation in the target, lithographic incompatibility of the target resulting in metrology bias in the overlay measurement, and increase in metrology footprint on a reticle and wafer to excessive target size.

SUMMARY

The present disclosure is directed to overlay target design including orthogonal underlayer dummyfill to cure one or more deficiencies in the current state of the art. In one aspect, the present disclosure is directed to an overlay target including one or more segmented overlay pattern elements forming at least one overlay target structure. The overlay target further includes one or more inactive pattern elements forming at least one dummyfill target structure. Each of the one or more inactive pattern elements may include dummyfill segmented along an axis orthogonal to a segmentation axis of at least one proximately disposed overlay pattern element. According to various embodiments, each of the target structures or layers may be formed from a separate process layer successively disposed upon a substrate, such as a silicon wafer.

In another aspect, the disclosure is directed to an overlay metrology system for performing an overlay measurement on the substrate. The system may include a sample stage configured to support a substrate with an overlay target disposed upon the substrate, the overlay target including one or more segmented overlay pattern elements forming at least one overlay target structure, the overlay target further including one or more inactive pattern elements forming at least one dummyfill target structure, each of the one or more inactive pattern elements including dummyfill segmented along an axis orthogonal to a segmentation axis of at least one proximately disposed overlay pattern element. The system may further include at least one illumination source configured to illuminate the overlay target and at least one detector configured to receive illumination reflected, scattered, or radiated from the overlay target. At least one computing system communicatively coupled to the detector may be configured to determine a misalignment between at least two layers disposed upon the substrate utilizing information (e.g. one or more image frames or contrast data) associated with the illumination reflected, scattered, or radiated from the overlay target. In some embodiments, the overlay and dummyfill target structures are twofold or fourfold rotationally symmetric to allow for certain manufacturing or metrology advantages. However, twofold or fourfold rotational symmetry is not required by all applications, such as those employing scatterometry overlay (SCOL) or diffraction based overlay (DBO) metrology targets.

In yet another aspect, the disclosure is directed to a method of performing overlay metrology upon the substrate including at least the following steps: illuminating an overlay target disposed upon the substrate, the overlay target including one or more segmented overlay pattern elements forming at least one overlay target structure, the overlay target further including one or more inactive pattern elements forming at least one dummyfill target structure, each of the one or more inactive pattern elements including dummyfill segmented along an axis orthogonal to a segmentation axis of at least one proximately disposed overlay pattern element; detecting illumination reflected, scattered, or radiated from the overlay target; and determining a misalignment between at least two layers disposed upon the substrate utilizing information associated with the detected illumination.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

FIGS. 1A through 8 generally illustrate the design and use of an overlay with orthogonal underlayer dummyfill in accordance with various embodiments of this disclosure. U.S. patent application Ser. No. 13/186,144, at least in part, describes orthogonal alignment of dummyfill with an overlay target structure disposed below or over the dummyfill. Additionally, U.S. patent application Ser. No. 12/455,640 describes metrology targets at least partially including dummyfill, referred to therein as "dummy field." U.S. patent application Ser. No. 13/186,144 and Ser. No. 12/455,640 are incorporated by reference, as if entirely set forth herein. The following embodiments are provided for illustrative purposes, and it should be understood that the features and arrangements described below may be combined to produce additional embodiments. For example, those skilled in the art will appreciate that portions of the following embodiments may be combined to achieve an overlay target or an overlay metrology system complying with a set of manufacturing design rules or satisfying a selected level of process compatibility.

Figure 1A:
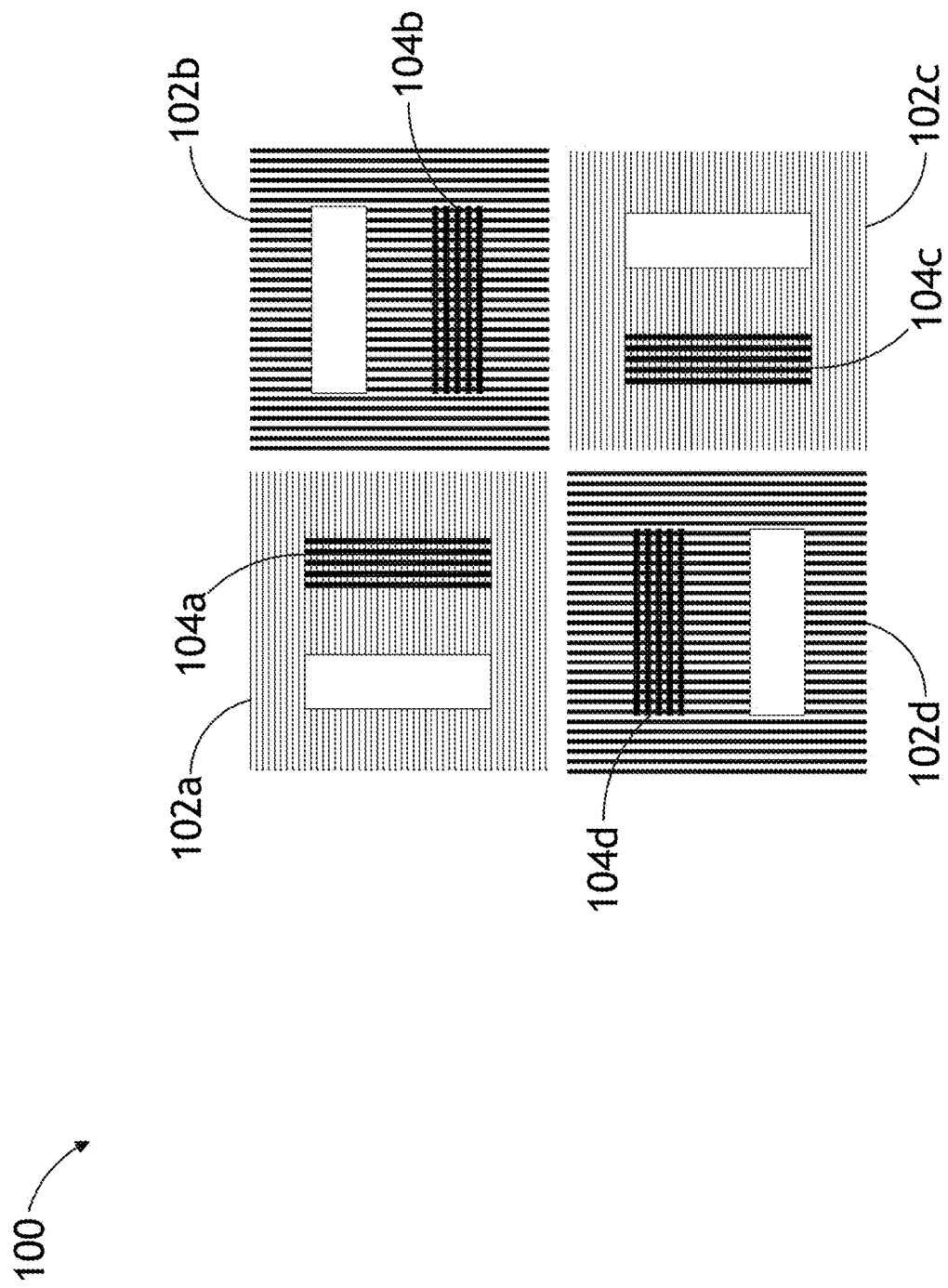
FIG. 1A illustrates an overlay target, in accordance with an embodiment of this disclosure.

FIG. 1A illustrates an overlay metrology target 100 in accordance with an embodiment of this disclosure. The overlay target 100 may include a plurality of target structures. In some embodiments, the target structures are manufactured from a separate process layer and successively disposed upon a substrate, such as a silicon wafer. The target 100 may include one or more of inactive pattern elements 102a-102d essentially consisting of segmented dummyfill. The inactive pattern elements 102a-102d may form at least a first "dummyfill" target structure. The target 100 may further include one or more overlay pattern elements 104a-104d formed from overlay features known to the art, such as those described or referenced in U.S. patent application Ser. No. 13/186,144 and/or Ser. No. 12/455,640.

Figure 1B:
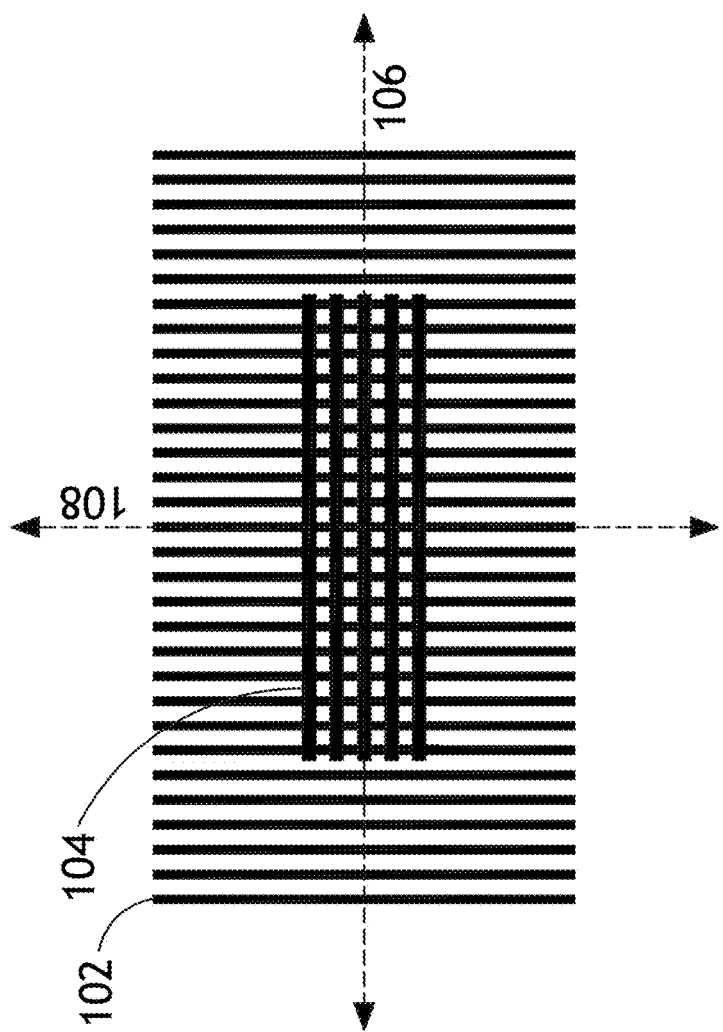
FIG. 1B illustrates a portion of the overlay target wherein a segmentation axis of a dummyfill pattern element is orthogonal to a segmentation axis of an overlay pattern element, in accordance with an embodiment of this disclosure.

The overlay pattern elements 104a-104d may form at least a second "overlay" target structure disposed proximate to the dummyfill target structure. For example, the overlay target structure may be subsequently disposed upon the substrate over the dummyfill target structure. Hence, the dummyfill target structure may be referred to as a "dummyfill underlayer." The dummyfill 102a-102d and/or overlay pattern elements 104a-104d may be segmented according to manufacturing/testing design rules or according to a selected range or selected deviation from design rules. As illustrated by FIG. 1B, each dummyfill pattern element 102 may be segmented along a first "dummyfill" segmentation axis 106 that is orthogonal to a second "overlay" segmentation axis 108 corresponding to at least one segmented overlay pattern element 104 disposed above or below the dummyfill pattern element 102. Further, in some embodiments at least a first set of one or more dummyfill pattern elements 102a, 102c is segmented in a direction orthogonal to a segmentation direction of a second set of one or more dummyfill pattern elements 102b, 102d.

Figure 2A:
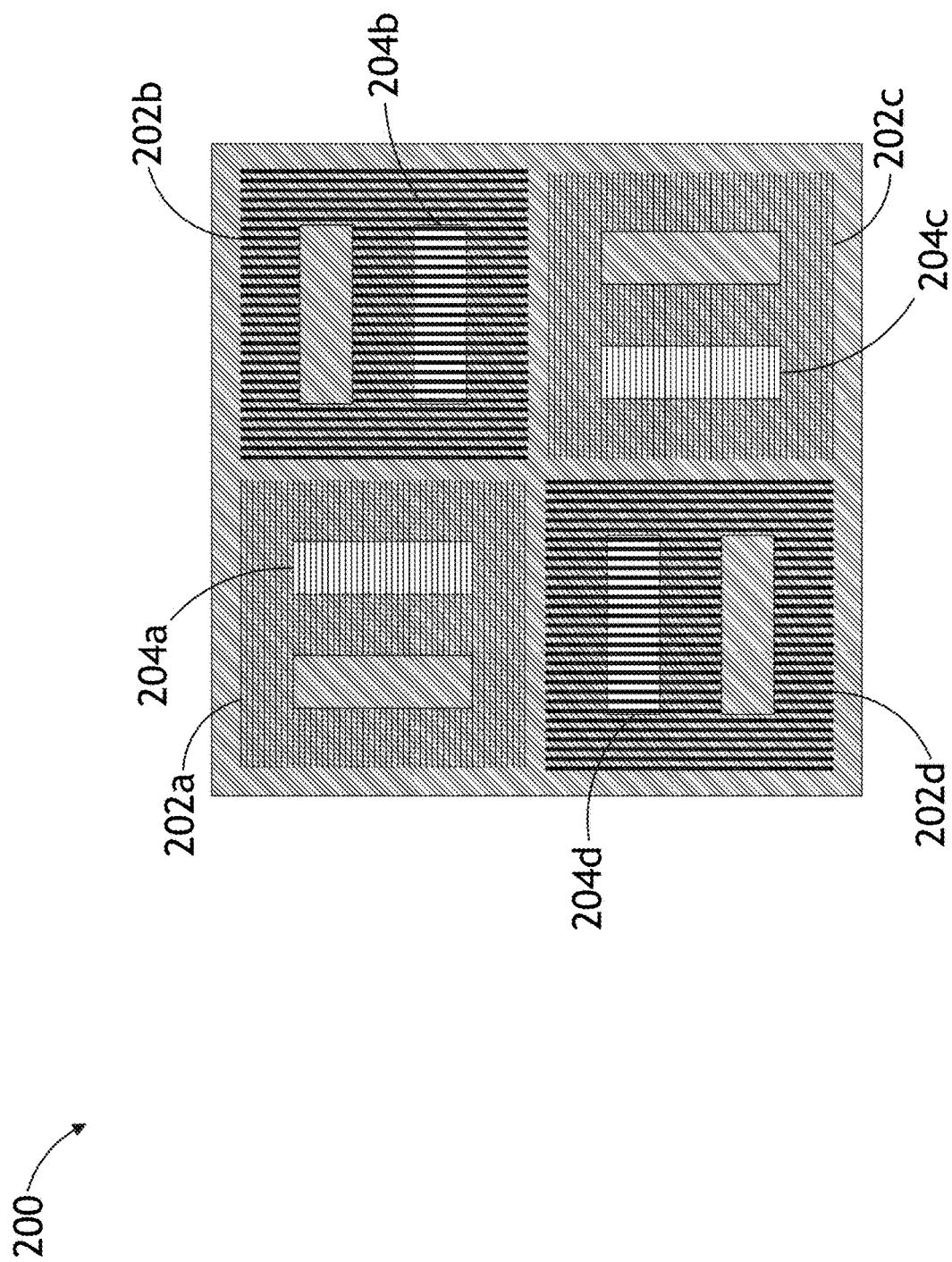
FIG. 2A illustrates a two/fourfold symmetric overlay target, in accordance with an embodiment of this disclosure.
Figure 2B:
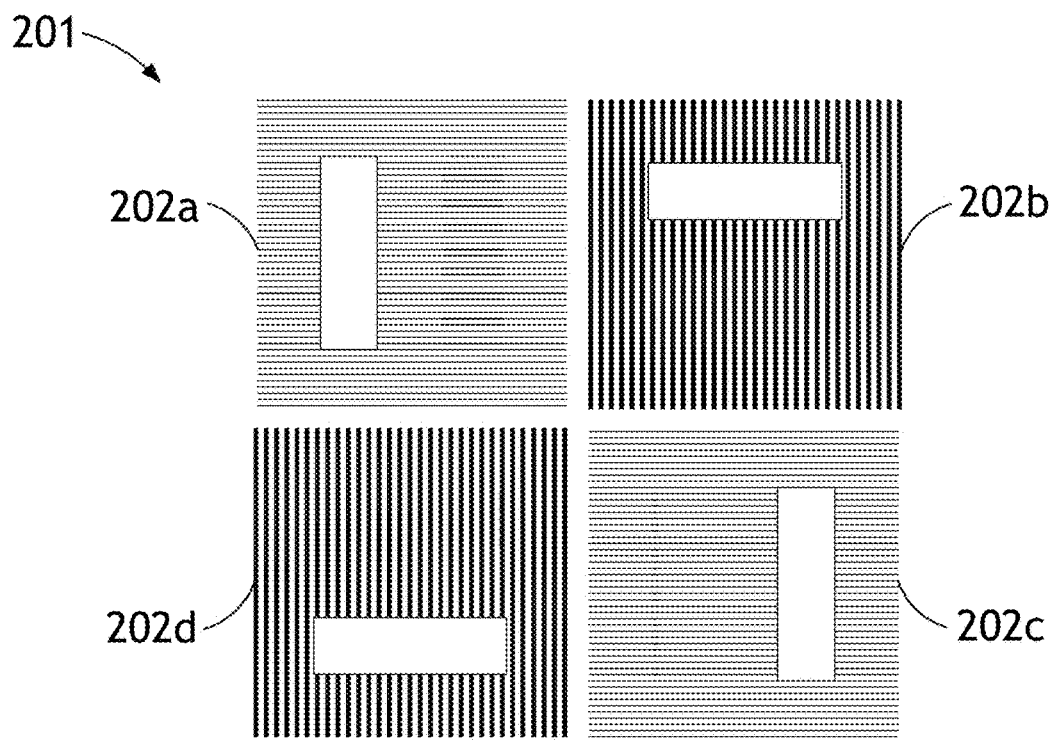
FIG. 2B illustrates a dummyfill target structure and an overlay target structure of the two/fourfold symmetric overlay target, in accordance with an embodiment of this disclosure.
Figure 2B:
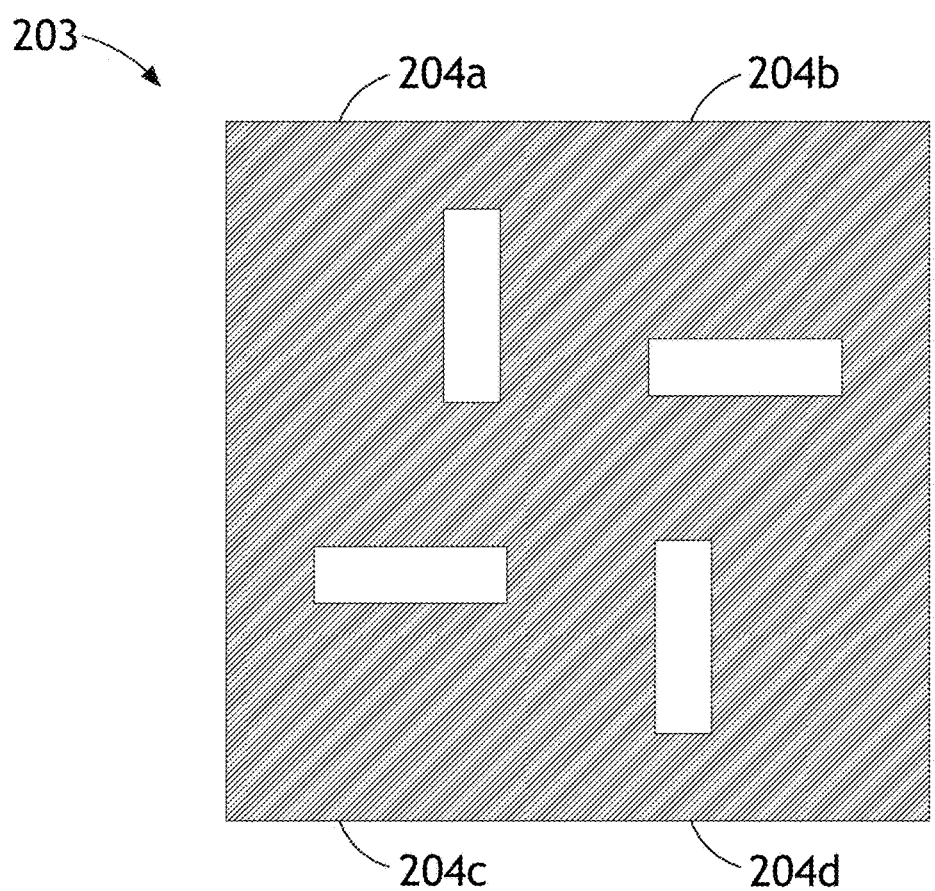

The segmented dummyfill pattern elements 102 may include dummyfill disposed upon empty regions reserved for pattern elements, such as device or overlay pattern elements, subsequently disposed according to one or more successive process layers of the substrate. The dummyfill pattern elements 102 may further include inner edges (e.g. one or more rectangular apertures) enabling location estimation of at least one overlay or dummyfill pattern element making up a portion of the overlay target 100. FIGS. 2A and 2B illustrate a two/fourfold symmetric overlay target 200 including a dummyfill target structure 201 formed from a plurality of dummyfill pattern elements 202a-202d disposed proximate to an overlay target structure 203 formed from a plurality of overlay pattern elements 204a-204d. In some embodiments, each target structure 201 and 203 is twofold or fourfold rotationally symmetric such that the resulting target structure 200 formed from the disposition of the overlay target structure 203 over the dummyfill target structure 201 is correspondingly twofold or fourfold rotationally symmetric. In some embodiments, for example, the target 200 is fourfold rotationally symmetric. Further, each of the dummyfill pattern elements 202a-202d may include single-axis segmentation dummyfill forming a twofold rotationally symmetric sub-pattern.

In some embodiments, the dummyfill sub-patterns 202a-202d are segmented along a selected axis wherein the size and spacing of the dummyfill segments along the segmentation axis are selected according to spatial or physical characteristics of overlay pattern elements 204a-204d printed over the dummyfill pattern elements 202a-202d. For example, the dummyfill segmentation may be selected according to feature size, spacing, and/or segmentation of the subsequently printed overlay pattern elements 204a-204d in order to avoid contamination of a metrology signal associated with overlay features disposed upon the substrate orthogonal to the dummyfill segments. In some embodiments, pitch and/or feature size of dummyfill segmentation is substantially larger than minimum design rules for an exposure tool, such as a lithographic exposure tool, on which the dummyfill sub-patterns are to be exposed (i.e. printed or disposed upon a surface of the substrate). The oversized segmentation may advantageously reduce pullback (e.g. asymmetric pullback) of line ends.

Figure 3A:
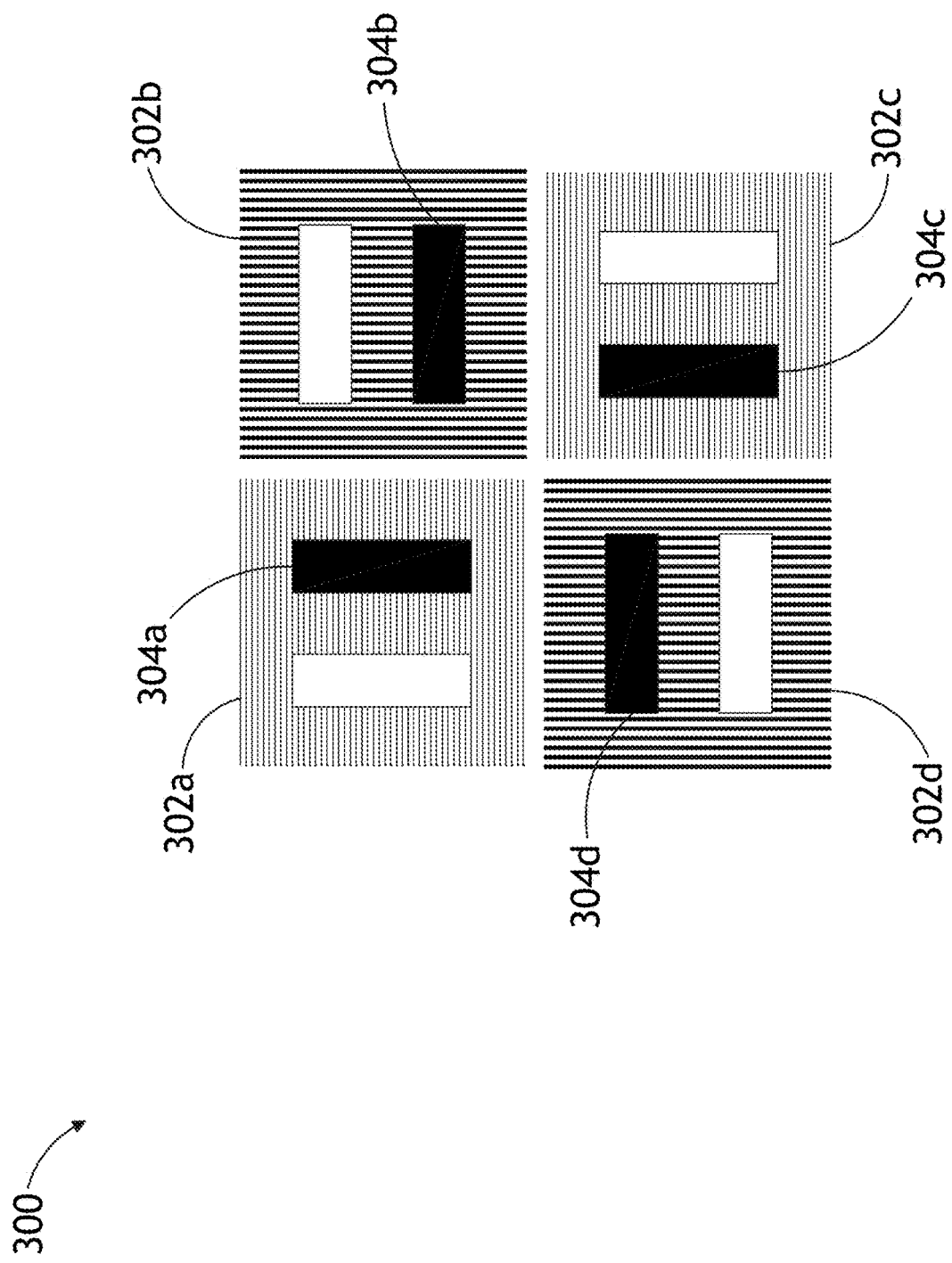
FIG. 3A illustrates a two/fourfold symmetric overlay target, in accordance with an embodiment of this disclosure.
Figure 3B:
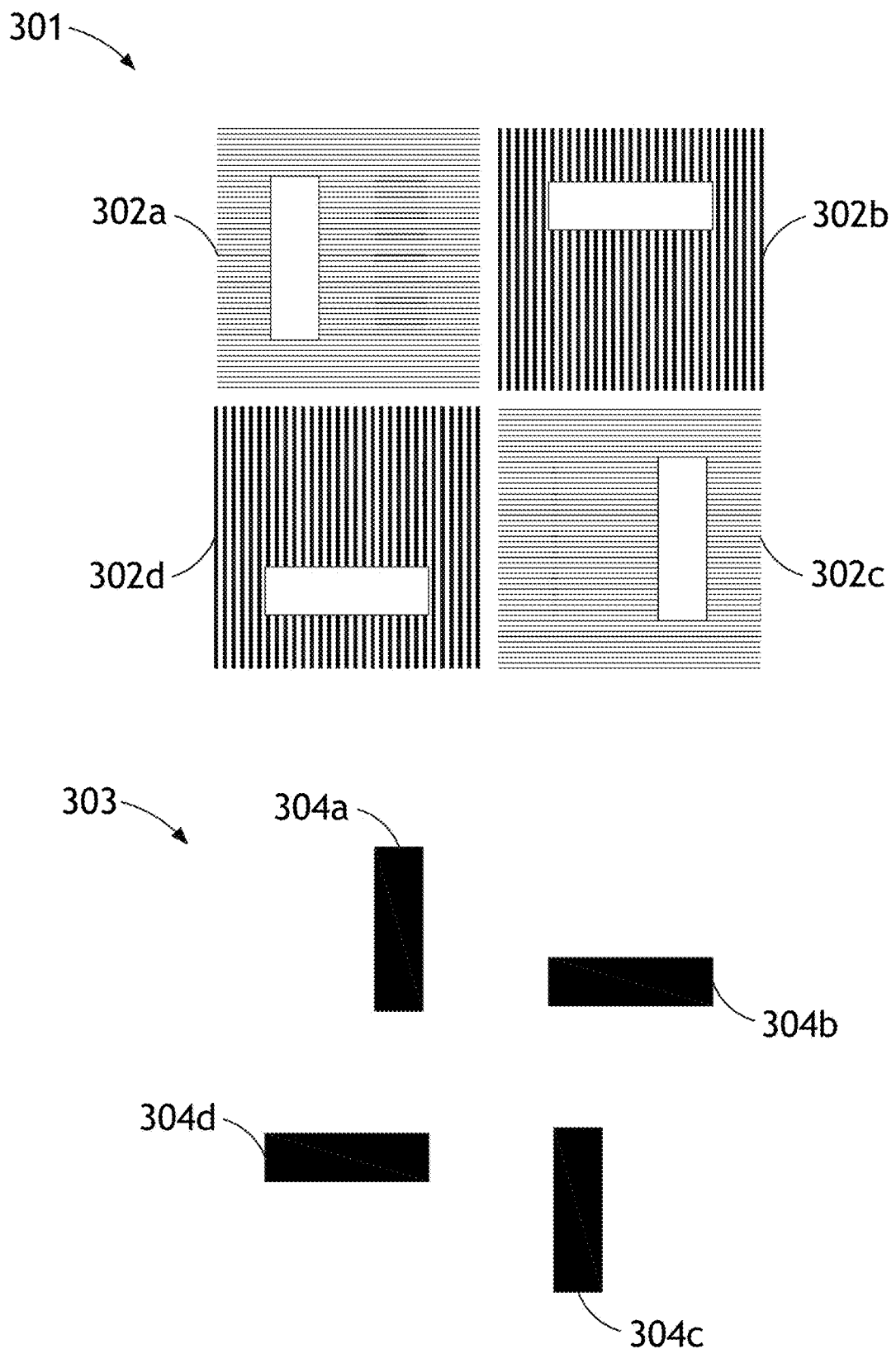
FIG. 3B illustrates a dummyfill target structure and an overlay target structure of the two/fourfold symmetric overlay target, in accordance with an embodiment of this disclosure.

As illustrated in FIG. 3A, an overlay metrology target 300 may include single-axis segmented dummyfill pattern elements 302a-302d with proximately disposed overlay pattern elements 304a-304d, whereby the boundaries of the subsequently overlaid sub-patterns are completely within boundaries formed by the dummyfill sub-patterns. FIG. 3B further illustrates a dummyfill target structure 301 formed from the dummyfill pattern elements 302a-302d and an overlay target structure 303 formed from the overlay pattern elements 304a-304d. In some embodiments, a selected distance between the boundaries of the dummyfill sub-patterns and the overlaid sub-patterns is greater than a predetermined optical exclusion zone. The distance between the boundaries may be greater than the predetermined optical exclusion zone only along an axis parallel or an axis perpendicular to the dummyfill segmentation axis, or in both the parallel and perpendicular directions.

Figure 4A:
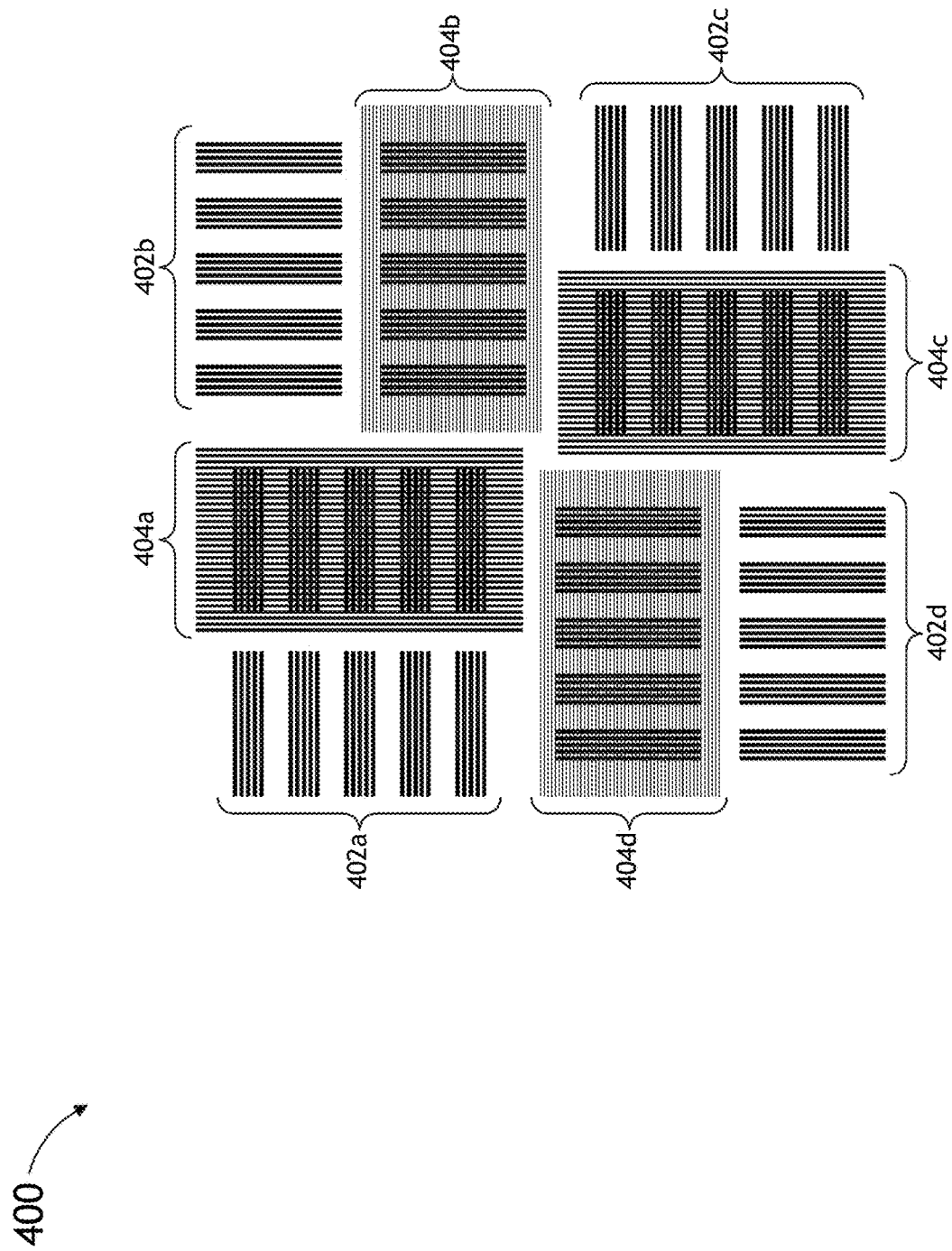
FIG. 4A illustrates a two/fourfold symmetric overlay target, in accordance with an embodiment of this disclosure.
Figure 4B:
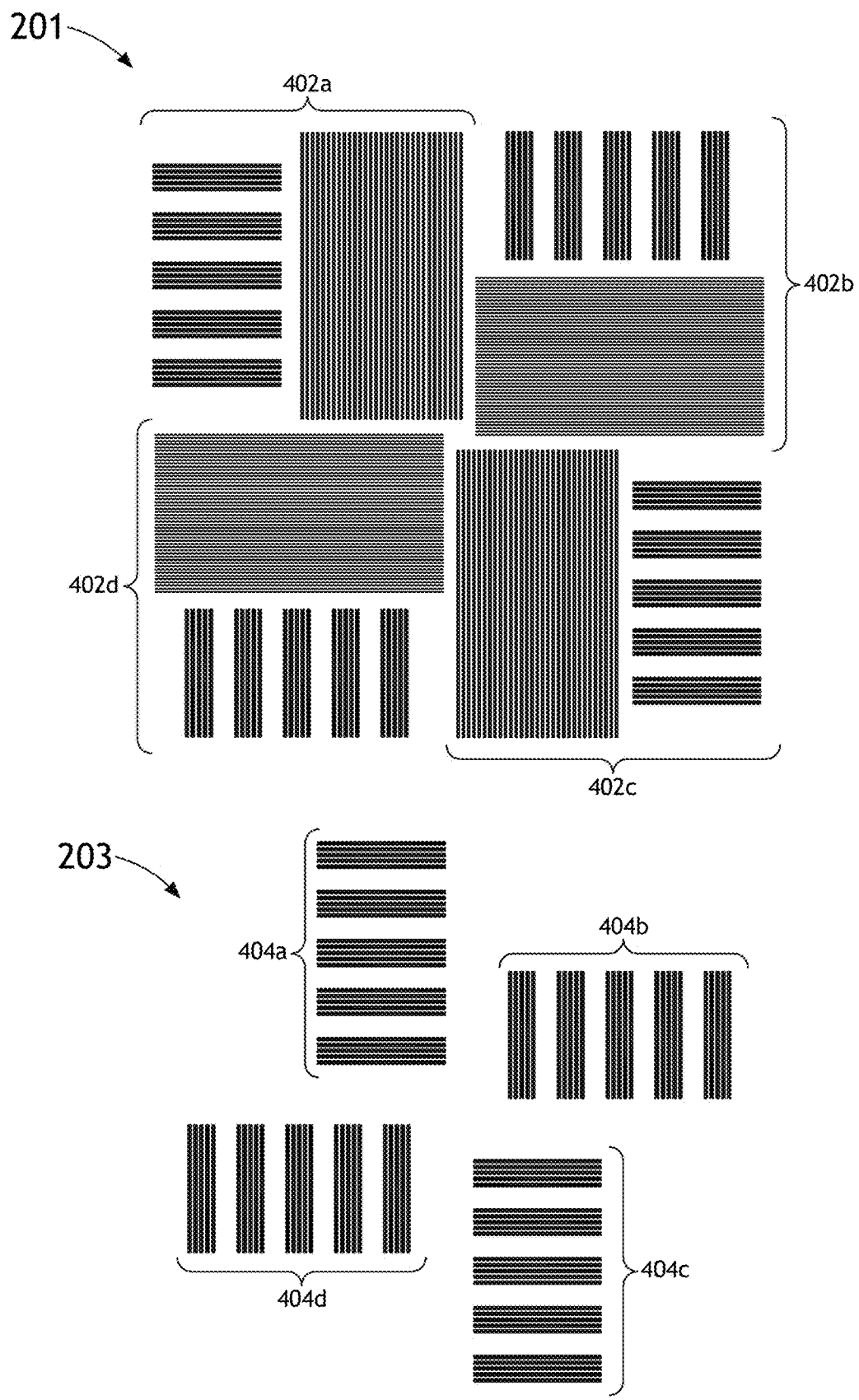
FIG. 4B illustrates a dummyfill target structure and an overlay target structure of the two/fourfold symmetric overlay target wherein each of the target structures includes a plurality of pattern elements, in accordance with an embodiment of this disclosure.
Figure 5A:
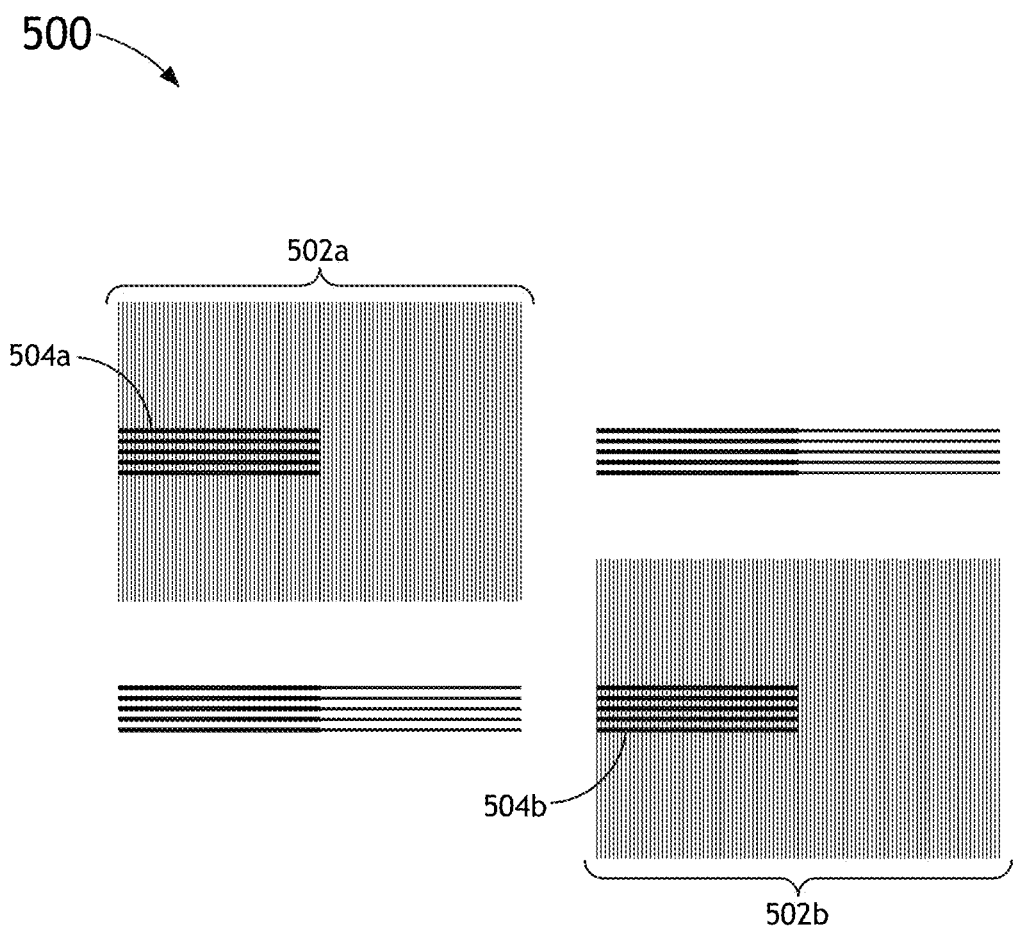
FIG. 5A illustrates a twofold symmetric overlay target wherein a first portion of overlay pattern elements is printed over dummyfill according to a first exposure, in accordance with an embodiment of this disclosure.
Figure 5B:
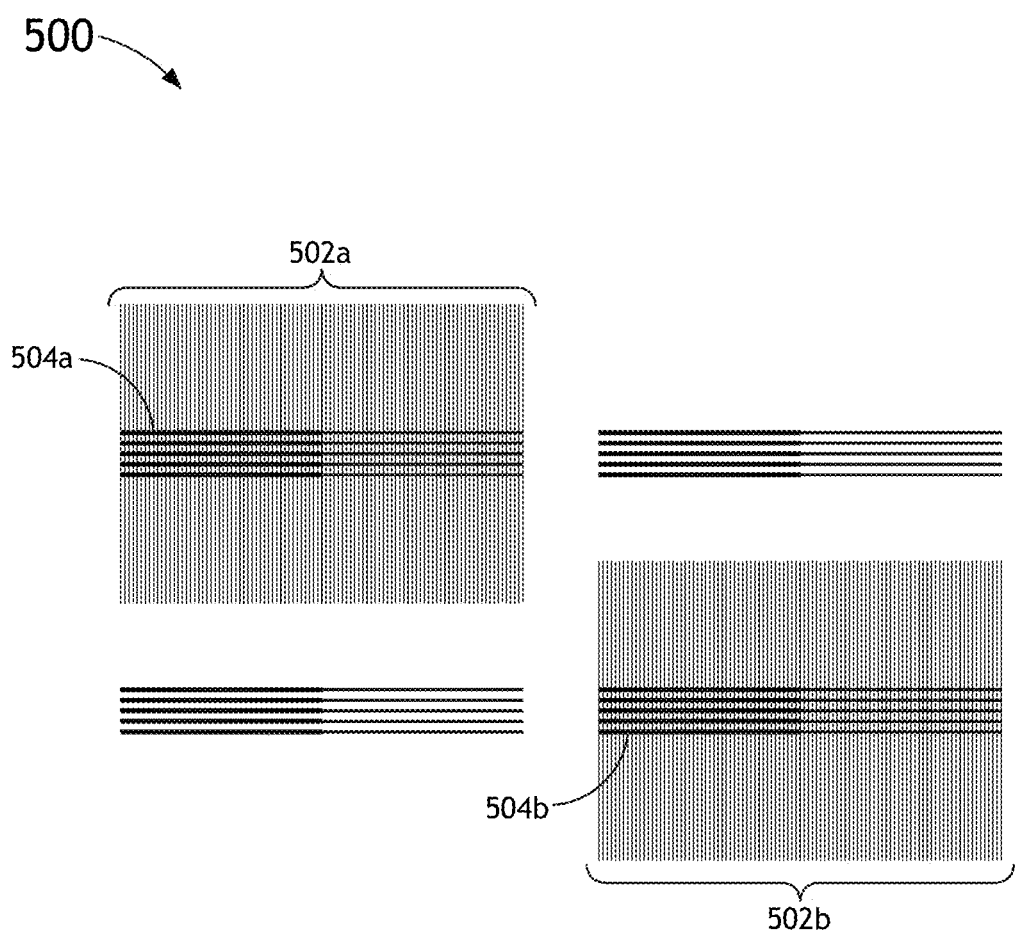
FIG. 5B illustrates the twofold symmetric overlay target wherein a second portion of overlay pattern elements is printed over dummyfill according to a second exposure, in accordance with an embodiment of this disclosure.
Figure 6:
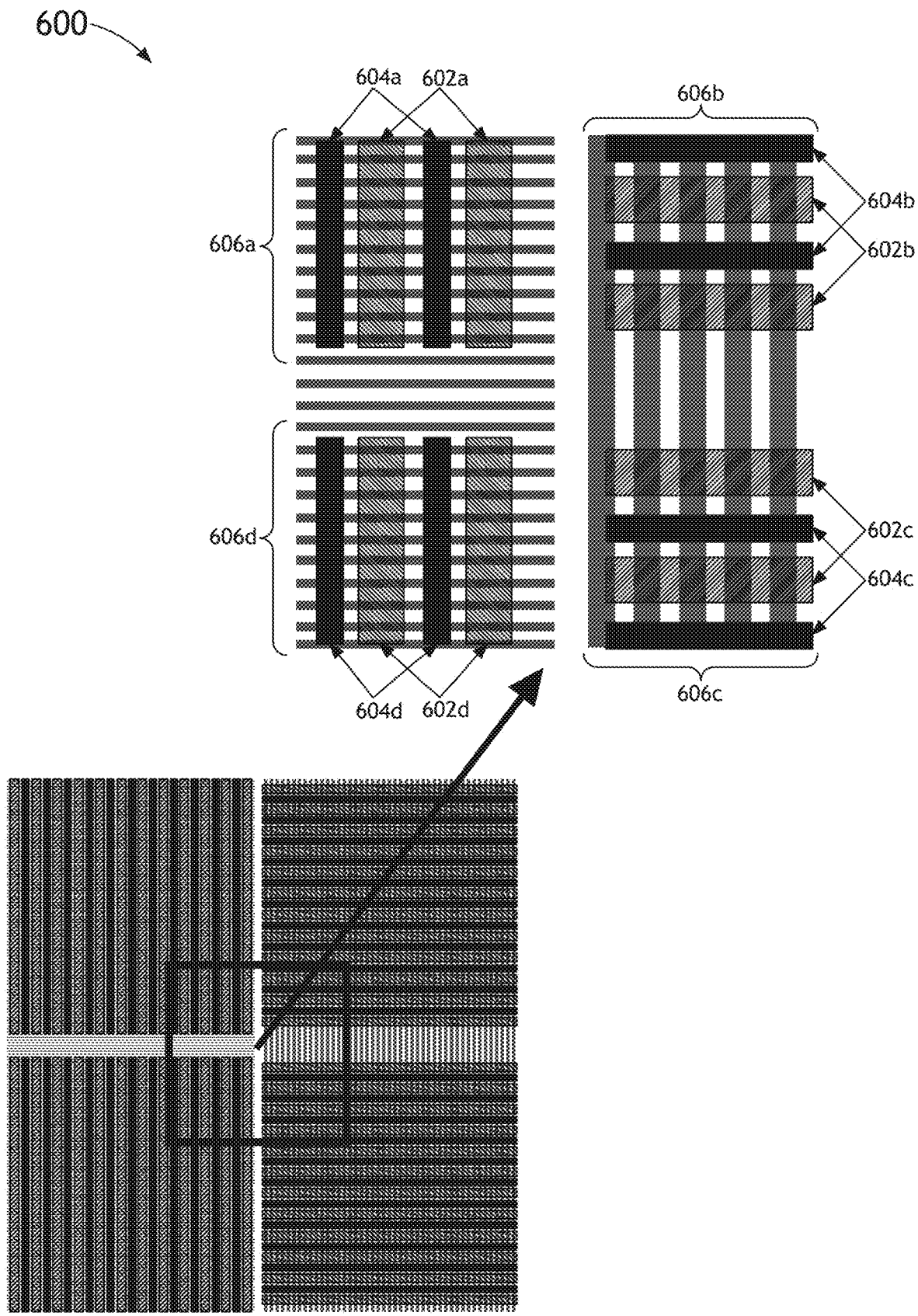
FIG. 6 illustrates an overlay target, in accordance with an embodiment of this disclosure.

As shown in FIGS. 4A and 4B, a twofold/fourfold rotationally symmetric overlay target 400 may include a plurality of overlay and dummyfill sub-patterns in each quadrant. For example, each quadrant of the overlay target 400 may include six dummyfill pattern elements 402a-402d forming a dummyfill target structure 401. Each quadrant may further include five overlay pattern elements 404a-404d forming an overlay target structure 403 disposed on top of the dummyfill target structure 401. A twofold rotationally symmetric overlay target may be similarly designed with a plurality of overlay and dummyfill sub-patterns in each of the top and bottom or left and right halves.

In some embodiments, portions of the dummyfill or overlay sub-patterns are separately printed upon the substrate in two or more side-by-side exposures. For example, in an embodiment of an overlay target 500 illustrated in FIGS. 5A and 5B, overlay pattern elements 504a and 504b are printed over a dummyfill underlayer 502a and 502b according to a first exposure (see FIG. 5A) and a second exposure (see FIG. 5B). The segmented dummyfill sub-patterns may be printed in separate exposures where there is no exclusion zone between the overlay sub-patterns. Further, the dummyfill segmentation may be identical for each of the dummyfill sub-patterns and aligned according to a lithographic overlay tolerance. In some embodiments, the overlay target may further include subsequently overlaid segmented dummyfill sub-patterns with identical segmentation and in alignment within the lithographic overlay tolerance.

In some embodiments, such as the exemplary embodiment illustrated in FIGS. 2A and 2B, the overlay target 200 may further include overlay sub-patterns 204a-204d and/or dummyfill sub-patterns 202a-202d having internal edges (i.e. including a rectangular opening or "window") which may be measured to estimate the location of at least one pattern element defining an overlay or dummyfill sub-pattern. Accordingly, the overlay target 200 may include an arrangement enabling sub-pattern location estimation in a direction parallel and/or perpendicular to a segmentation axis of each overlay or dummyfill pattern element. In some embodiments, the sub-pattern location estimation may be performed only in a direction perpendicular to dummyfill segmentation lines to avoid enhanced scanner aberration sensitivity at an edge location, particularly as a function of scanner focus. Alternatively, the sub-pattern location estimation may be performed only in a direction parallel to dummyfill segmentation lines to avoid design rule violations.

Certain embodiments of the overlay target may be advantageous for specific metrology or process compatibility requirements. In one embodiment, for example, a fourfold rotationally symmetric overlay target may include a plurality of layers (e.g. four layers). Each quadrant of the overlay target may include two segmented dummyfill sub-patterns enabling measurement of overlay along a first axis orthogonal to the dummyfill segmentation. Each quadrant may further include two segmented overlay sub-patterns subsequently disposed over the dummyfill pattern elements. The overlaid sub-patterns may be arranged to enable measurement of overlay along a second axis orthogonal to the first axis (i.e. axis of measurement for the dummyfill sub-patterns). Alternatively, the overlaid sub-patterns may be arranged to enable measurement of overlay along a second axis parallel to the first axis.

In another exemplary embodiment, each quadrant of a (two layer) fourfold rotationally symmetric overlay target may include a single-axis segmented dummyfill sub-pattern substantially filling the respective quadrant with the exception of an opening (or window) having internal edges. The inner edges of the opening may be measured for sub-pattern location estimation in a direction parallel to the dummyfill segmentation. The target may further include a segmented overlay sub-pattern subsequently disposed over the dummyfill sub-pattern. The overlay sub-pattern may be segmented in accordance with manufacturing design rules. Additionally, edges of the overlay sub-pattern may be measured for sub-pattern location estimation in a direction parallel to the dummyfill segmentation axis.

In another exemplary embodiment, a twofold rotationally symmetric (four layer) overlay target may include four segmented dummyfill sub-patterns (two in an X direction and two in a Y direction). Each of the dummyfill sub-patterns may be arranged to enable measurement of overlay along a respective measurement axis. The overlay target may further include twelve segmented overlay sub-patterns (six in an X direction and six in a Y direction). Each of the overlay sub-patterns subsequently printed over the dummyfill sub-patterns may be arranged to further enable measurement of overlay along a respective measurement axis.

Those skilled in the art will appreciate the exemplary nature of the foregoing embodiments, and as such, the embodiments described herein should be understood as being illustrative and not intended to limit the disclosure in any way. In some embodiments, segmentation is based upon feature size of device or overlay layers in excess of minimum design rules, thereby increasing the process window of a sub-pattern to be greater than that of the resulting device. Further, the segmentation may be relatively small in comparison to the geometry of the sub-pattern itself. According to various embodiments, a segmented single-axis dummyfill underlayer may cover at least 50% of a process layer to improve metrology performance and process compatibility.

Various modifications are contemplated in segmentation spacing/pitch, number of process layers, symmetry, and other attributes of a metrology target. The embodiments, described above are illustrative of various features but are not intended to restrict the present disclosure in any way. For instance, various embodiments herein describe a twofold or fourfold rotationally symmetric overlay metrology target, but twofold/fourfold symmetry is not required in all applications. In some embodiments, illustrated by FIG. 6, an overlay metrology target 600 is neither twofold nor fourfold rotationally symmetric as a whole. However, various portions of the overlay target 600, such as individual sub-patterns or groupings of two or more sub-patterns, may be at least twofold symmetric.

Some applications, such as SCOL or DBO metrology, do not require a twofold/fourfold symmetric target. For example, the overlay target 600 may include a first plurality of overlay pattern elements 602a-602d forming a first overlay target structure and a second plurality of overlay pattern elements 604a-604d forming a second overlay target structure, both target structures successively formed over a dummyfill under layer including orthogonally aligned inactive pattern elements 606a-606d. As further shown in FIG. 6, the dummyfill segmentation (i.e. spacing and pitch) in a first (X) direction may differ from the dummyfill segmentation in a second (Y) direction.

In some embodiments, the target 600 allows for overlay measurement in a first direction according to a first target structure or layer defined by the first plurality of overlay pattern elements 602a-602d. Further, overlay may be measured in at least a second direction according to a second target structure or layer defined by the second plurality of overlay pattern elements 604a-604d. Those skilled in the art will appreciate that the number of layers and type (e.g. device, dummyfill, or overlay layers) may be varied without departing from the scope of this disclosure.

Figure 7:
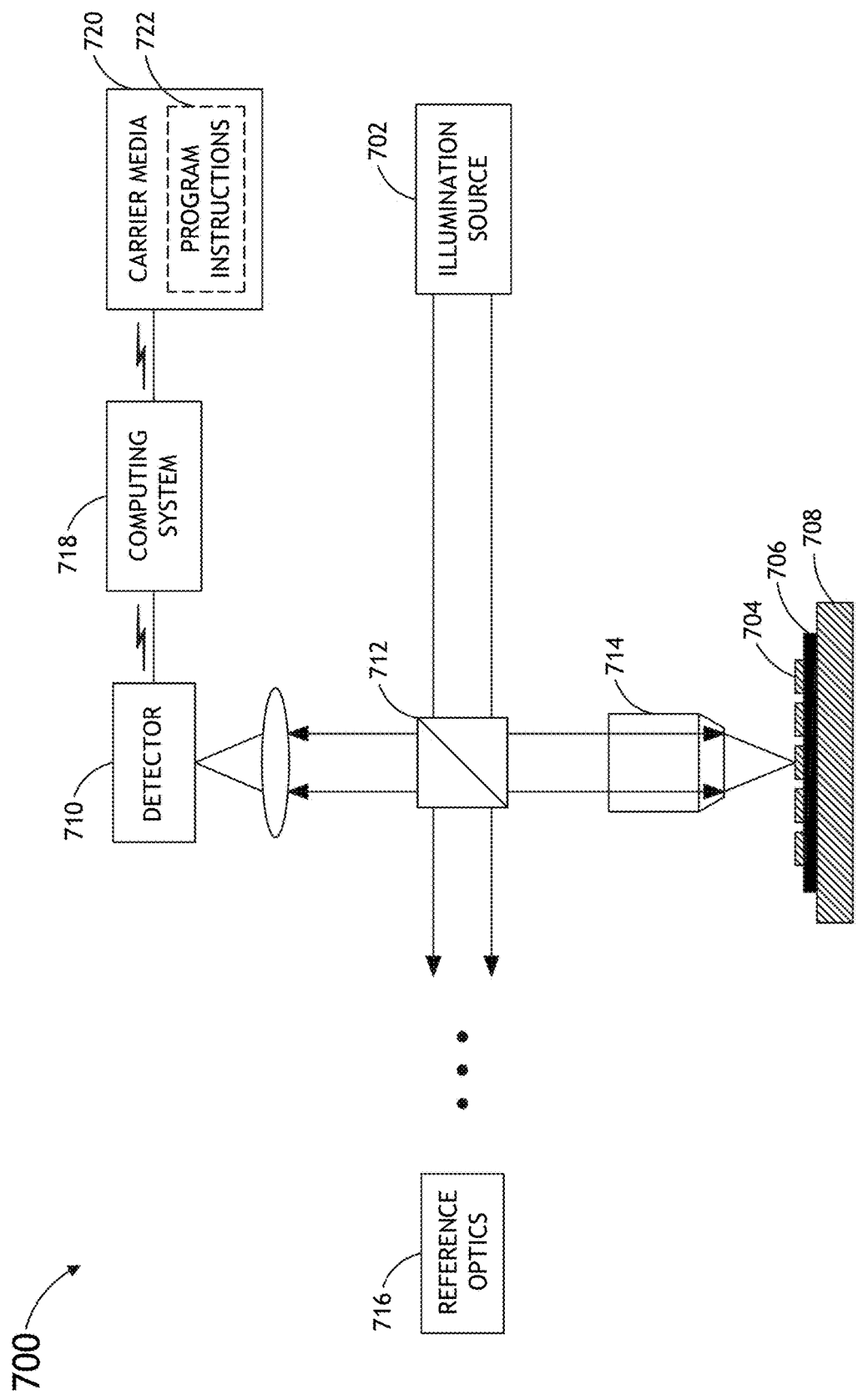
FIG. 7 is a block diagram illustrating an overlay metrology system, in accordance with an embodiment of this disclosure.

FIG. 7 is a block diagram illustrating an overlay metrology system 700 in accordance with an embodiment of this disclosure. The overlay metrology system 700 may include an optical metrology system, such as the systems described or referenced in U.S. patent application Ser. No. 13/186,144. The system 700 may include at least one illumination source 702 configured to illuminate an overlay metrology target 704 disposed upon a substrate 706, where the overlay target 704 includes a target in accordance with the foregoing embodiments. The substrate 706 may be supported by a sample stage 708, which may include at least one linear or rotating actuator for translating or rotating the substrate to a selected position.

The system may include at least one beam splitter 712 configured to direct illumination emanating from the illumination source 702 along at least a first (object) path to the overlay target 704 and second (reference) path delineated by reference optics 716, such as a reference mirror. Illumination reflected, scattered, or radiated from the surface of the substrate 706 including the overlay target 704 may be collected via an objective lens 714 and directed along a collection path to at least one detector 710. At least one computing system 718 in communication with the detector 710 may be configured to collect imaging data associated with the illumination received from the surface of the substrate 706. The computing system 718 may be configured to determine an overlay error or spatial misalignment between at least two layers formed on the substrate 706 utilizing information (e.g. image frames or contrast data) associated with the imaging data collected for the overlay target 704.

It should be recognized that the various steps and functions described throughout the present disclosure may be carried out by a single computing system or by multiple computing systems. For example, the computing system 718 may include, but is not limited to, a personal computing system, mainframe computing system, workstation, image computer, parallel processor, or any other device known in the art. In general, the computing system 718 may include at least one single-core or multiple-core processor configured to execute program instructions 722 from at least one carrier medium 720.

Figure 8:
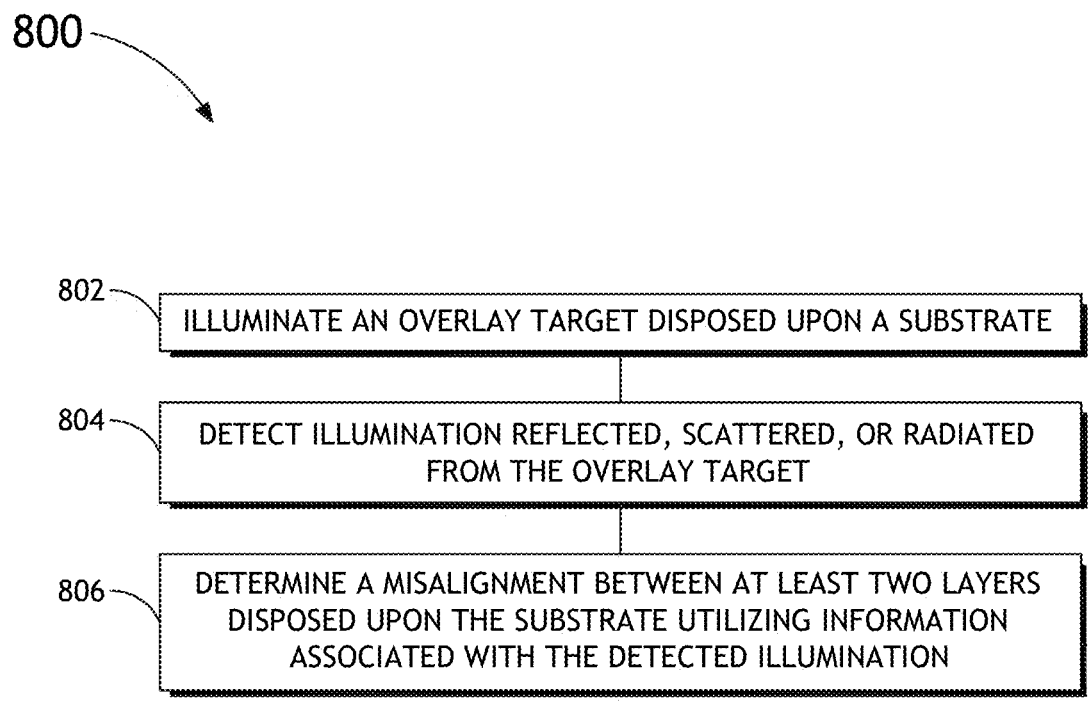
FIG. 8 is a flow diagram illustrating a method of performing overlay metrology, in accordance with an embodiment of this disclosure.

FIG. 8 generally illustrates a method 800 of performing overlay metrology in accordance with the overlay metrology system 700. It is recognized, however, that one or more steps of method 800 may be executed via systems or devices varying from the foregoing embodiments of system 700 without departing from the essence of the present disclosure. In an embodiment, the method 800 may include at least the following steps. At step 802, the overlay metrology target 704 disposed upon the substrate 706 is illuminated. At step 804, illumination reflected, scattered, or radiated by the target is collected via collection optics, such as the objective lens 714 and directed to at least one imaging detector 710, such as a TDI camera. At step 806, the imaging data is processed to determine a misalignment between at least two layers disposed upon the substrate. It is noted herein that the imaging data may be processed according to any overlay metrology algorithm known to the art. For example, a spatial comparison between pattern elements forming the target structure and/or patterns formed from device features may be performed to determine a relative displacement (i.e. overlay error).

In some embodiments, only inner edges of dummyfill pattern elements are measured to avoid polish damage. In some embodiments, a location of at least one dummyfill pattern element is determined via measurement in a first direction and a location of at least one overlay pattern element subsequently disposed upon the substrate 706 is determined via measurement in a second direction (e.g. along an axis orthogonal to the first direction). Further, edge locations of overlay or dummyfill sub-patterns segmented both parallel and perpendicular to the direction of measurement may be measured in order to determine a bias of measurement due resulting from the direction of the segmentation.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. Program instructions implementing methods such as those described herein may be transmitted over or stored on carrier media. A carrier medium may include a transmission medium such as a wire, cable, or wireless transmission link. The carrier medium may also include a storage medium such as a read-only memory, a random access memory, a magnetic or optical disk, or a magnetic tape.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

What is claimed is:

1. An overlay target, comprising:
   a first-layer overlay target structure including a plurality of overlay pattern elements segmented along a first direction, wherein the overlay target structure is formed on a first sample layer; and
   a dummy target structure including a plurality of inactive pattern elements segmented along a second direction orthogonal to the first direction, wherein the dummy target structure is formed on a second sample layer different than the first sample layer, wherein the plurality of inactive pattern elements are formed from dummyfill, wherein the dummyfill provides process compatibility for regions of a sample not containing device structures based on at least one design rule, wherein at least a portion of the dummy target structure overlaps the first-layer overlay target structure, wherein the dummy target structure includes a second-layer overlay target structure formed from an aperture in the plurality of inactive pattern elements, wherein the aperture is formed adjacent to the plurality of overlay pattern elements without overlapping the plurality of overlay pattern elements, wherein overlay between the first sample layer and the second sample layer is determinable based on a location of the first-layer overlay target structure and at least one internal edge of the second-layer overlay target structure.

2. The overlay target of claim 1, wherein the overlay target structure and the dummy target structure form a first cell, wherein the overlay target further comprises:
   two or more additional cells, wherein each of the two or more additional cells include an additional overlay target structure and an additional dummy target structure, wherein the overlay target is at least one of twofold or fourfold rotationally symmetric.

3. The overlay target of claim 1, wherein the plurality of inactive pattern elements include dummyfill segments disposed upon one or more regions reserved for overlay pattern elements of at least one subsequent process layer.

4. The overlay target of claim 1, wherein the plurality of inactive pattern elements include dummyfill segments disposed proximate to edge regions of the plurality of inactive pattern elements to enable location estimation of at least one pattern element.

5. The overlay target of claim 1, wherein the dummy target structure is twofold rotationally symmetric.

6. The overlay target of claim 1, wherein the plurality of overlay pattern elements are formed over the plurality of inactive pattern elements.

7. The overlay target of claim 1, wherein the plurality of inactive pattern elements are segmented according to a selected pitch or feature size which is substantially greater than minimum design rules specified for an exposure tool configured to expose the plurality of inactive pattern elements.

8. The overlay target of claim 1, wherein the plurality of overlay pattern elements are formed on a subsequent process layer over the plurality of inactive pattern elements within boundaries defined by the plurality of inactive pattern elements.

9. The overlay target of claim 8, wherein a distance between the boundaries and the plurality of overlay pattern elements is greater than a predetermined optical exclusion zone along the first direction.

10. The overlay target of claim 8, wherein a distance between the boundaries and the plurality of overlay pattern elements is greater than a predetermined optical exclusion zone along the second direction.

11. The overlay target of claim 8, wherein a selected distance between the boundaries and the plurality of overlay pattern elements is greater than a predetermined optical exclusion zone along the first direction.

12. The overlay target of claim 8, wherein the plurality of overlay pattern elements are printed via two or more side-by-side exposures.

13. The overlay target of claim 1, wherein the plurality of inactive pattern elements include uniformly spaced dummy-fill segments printed via separate exposures and aligned according to a lithographic overlay tolerance.

14. The overlay target of claim 1, wherein the plurality of inactive pattern elements include uniformly spaced dummy-fill segments formed on a subsequent process layer, wherein the dummyfill segments are printed via separate exposures and aligned according to a lithographic overlay tolerance.

15. The overlay target of claim 1, wherein the plurality of overlay pattern elements are segmented according to a device feature size.

16. The overlay target of claim 1, wherein the segmented dummyfill covers a majority of at least one sample layer.

17. A system for performing overlay measurements, comprising:
   a sample stage configured to support a sample including an overlay target, the overlay target including a plurality of overlay pattern elements segmented along a first direction and formed on a first sample layer, the overlay target further including a dummy target structure including a plurality of inactive pattern elements segmented along a second direction orthogonal to the first direction, wherein the dummy target structure is formed on a second sample layer different than the first sample layer, wherein the plurality of inactive pattern elements are formed from dummyfill, wherein the dummyfill provides process compatibility for regions of the sample not containing device structures, wherein at least a portion of the dummy target structure overlaps the overlay target structure, wherein the dummy target structure includes an aperture defining a region without pattern elements, wherein the aperture is formed adjacent to the plurality of overlay pattern elements without overlapping the plurality of overlay pattern elements;

at least one illumination source configured to illuminate the overlay target;

at least one detector configured to receive illumination reflected, scattered, or radiated from the overlay target; and at least one computing system including one or more processors communicatively coupled to the detector and configured to determine an overlay between at least two layers disposed upon the sample based on a location of at least one of the plurality of overlay pattern elements and a location of at least one internal edge of the aperture measured using the illumination reflected, scattered, or radiated from the overlay target.

18. The system of claim 17, wherein the plurality of inactive pattern elements form at least one twofold or fourfold rotationally symmetric overlay target structure, and wherein the plurality of overlay pattern elements form at least one twofold or fourfold symmetric dummyfill target structure.

19. The system of claim 17, wherein the plurality of inactive pattern elements include dummyfill segments disposed upon one or more regions reserved for overlay pattern elements of at least one subsequent process layer.

20. The system of claim 17, wherein the plurality of inactive pattern elements include dummyfill segments disposed proximate to edge regions of the plurality of inactive pattern elements to enable location estimation of at least one pattern element.

21. The system of claim 17, wherein the computing system is further configured to determine a location of at least one pattern element based upon information collected in a direction perpendicular or parallel to the dummyfill segments.

22. The system of claim 17, wherein the computing system is further configured to determine a location of at least one pattern element based upon information collected in a direction perpendicular to the dummyfill segments and information collected in a direction parallel to the dummyfill segments.

23. The system of claim 17, wherein the computing system is further configured to determine a location of at least one inactive pattern element based upon information collected in a first direction and further configured to determine a location of at least one overlay pattern element based upon information collected in a second direction.

24. The system of claim 17, wherein the computing system is further configured to determine a measurement bias due to a direction of segmentation based upon edges of at least one pattern element located in a first direction parallel to a measurement axis and edges of the at least one pattern element located in a second direction perpendicular to the measurement axis.

25. The system of claim 17, wherein the computing system is configured to measure overlay alignment in a first direction.

26. The system of claim 25, wherein the computing system is further configured to measure overlay alignment in a second direction, wherein the first direction is associated with a first overlay target structure disposed upon a substrate, and wherein the second direction is associated with a second overlay target structure subsequently disposed upon the substrate.

27. The system of claim 25, wherein the computing system is further configured to measure overlay alignment in a second direction, wherein the first direction is associated with an overlay target structure disposed upon a substrate over a dummyfill target structure, and wherein the second direction is associated with the dummyfill target structure.

28. A method of performing overlay measurements, comprising:

illuminating a sample including an overlay target, the overlay target including a plurality of overlay pattern elements segmented along a first direction and formed on a first sample layer, the overlay target further including a dummy target structure including a plurality of inactive pattern elements segmented along a second direction orthogonal to the first direction, wherein the dummy target structure is formed on a second sample layer different than the first layer of the sample, wherein the plurality of inactive pattern elements are formed from dummyfill, wherein the dummyfill provides process compatibility for regions of the sample not containing device structures based on at least one design rule, wherein at least a portion of the dummy target structure overlaps the overlay target, wherein the dummy target structure includes an aperture defining a region without pattern elements, wherein the aperture is formed adjacent to the plurality of overlay pattern elements without overlapping the plurality of overlay pattern elements, wherein a distance between at least one internal edge of the aperture and the plurality of overlay pattern elements is indicative of overlay between the first layer and the second layer;

detecting illumination reflected, scattered, or radiated from the overlay target; and determining an overlay between at least two sample layers based on a location of at least one of the plurality of overlay pattern elements and a location of at least one internal edge of the aperture measured using the illumination reflected, scattered, or radiated from the overlay target.

29. The method of claim 28, wherein the plurality of inactive pattern elements form at least one twofold or fourfold rotationally symmetric overlay target structure, and wherein the plurality of overlay pattern elements form at least one twofold or fourfold symmetric dummyfill target structure.

30. The method of claim 28, wherein the plurality of inactive pattern elements include dummyfill segments disposed upon one or more regions reserved for overlay pattern elements of at least one subsequent process layer.

31. The method of claim 28, wherein the plurality of inactive pattern elements include dummyfill segments disposed proximate to edge regions of the plurality of pattern elements to enable location estimation of at least one pattern element.

32. The method of claim 28, further comprising:
determining a location of at least one pattern element based upon information associated with the illumination detected in a direction perpendicular or parallel to the dummyfill segments.

33. The method of claim 28, further comprising:
determining a location of at least one pattern element based upon information associated with the illumination detected in a direction perpendicular to the dummyfill segments and information associated with the illumination detected in a direction parallel to the dummyfill segments.

34. The method of claim 28, further comprising:
determining a location of at least one inactive pattern element based upon information associated with illumination detected along a first measurement axis; and determining a location of at least one overlay pattern element based upon information associated with illumination detected along a second measurement axis.

35. The method of claim 28, further comprising:
determining a measurement bias due to a direction of segmentation based upon edges of at least one pattern element located in first direction parallel to a measurement axis and edges of the at least one pattern element located in a second direction perpendicular to the measurement axis.

36. The method of claim 28, further comprising:
measuring overlay alignment in the first direction.

37. The method of claim 36, further comprising:
measuring overlay alignment in the second direction, wherein the first direction is associated with a first overlay target structure disposed upon a substrate, and wherein the second direction is associated with a second overlay target structure subsequently disposed upon the substrate.

38. The method of claim 36, further comprising:
measuring overlay alignment in a second direction, wherein the first direction is associated with an overlay target structure disposed upon a substrate over a dummyfill target structure, and wherein the second direction is associated with the dummyfill target structure.

39. A overlay target, comprising:
a dummy target structure formed on a first sample layer, the dummy target structure including dummyfill segmented along a first direction, wherein the dummyfill provides process compatibility for regions of the sample not containing device structures based on at least one design rule;
a first overlay target structure printed over and overlapping the dummy target structure, the first overlay target structure including a first plurality of pattern elements segmented along a second direction orthogonal to the first direction; and
a second overlay target structure printed over and overlapping the dummy target structure, the second overlay target structure including a second plurality of pattern elements segmented along the second direction, wherein the first overlay target structure and the second overlay target structure are formed in two or more side-by-side exposures with no exclusion zone and no overlap between the first overlay target structure and the second target structure, wherein at least a portion of the first plurality of pattern elements and the second plurality of pattern elements are aligned in the first direction when the first sample layer and a second sample layer are aligned.

40. The overlay target of claim 39, wherein the first overlay target structure is fourfold rotationally symmetric.

41. The overlay target of claim 39, wherein the second overlay target structure is fourfold rotationally symmetric.

* * * * *